(12) United States Patent
Naniwae et al.

(10) Patent No.: US 6,178,190 B1
(45) Date of Patent: Jan. 23, 2001

(54) II-VI COMPOUND SEMICONDUCTOR LIGHT EMITTING DEVICE

(75) Inventors: Koichi Naniwae; Hiroshi Iwata, both of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/127,781

(22) Filed: Aug. 3, 1998

(30) Foreign Application Priority Data

Aug. 4, 1997 (JP) .................................................. 9-209287

(51) Int. Cl.[7] ........................... H01L 29/22; H01L 33/00; H01S 5/00
(52) U.S. Cl. ................................ 372/45; 257/78; 257/103
(58) Field of Search .............................. 372/45; 257/614, 257/79, 94, 96, 97, 103, 163, 200

(56) References Cited

U.S. PATENT DOCUMENTS 5,773,850 * 6/1998 Naniwae ................................ 257/78

FOREIGN PATENT DOCUMENTS

| 2-125477 | 5/1990 | (JP) . |
| 5-21892 | 1/1993 | (JP) . |
| 7-94832 | 4/1995 | (JP) . |

OTHER PUBLICATIONS

H. Okuyama et al, Epitaxial growth of p–type ZnMgSSe, Appl. Phys. Lett. vol. 64, No. 7, Feb. 14, 1994, pp. 904–906.*

* cited by examiner

Primary Examiner—Frank G. Font
Assistant Examiner—Armando Rodriquez
(74) Attorney, Agent, or Firm—McGinn & Gibb, P.C.

(57) ABSTRACT

A semiconductor light emitting device has a stacked structure including an n-type clad layer, an active layer, and a p-type clad layer on an InP substrate. The p-type clad layer is made from an MgZnSeTe-based compound semiconductor lattice-matched with InP. The n-type clad layer is made from a compound semiconductor lattice-matched with InP and selected from an MgZnSeTe-based compound semiconductor, an MgZnCdSe-based compound semiconductor, and an MgCdSSe-based compound semiconductor.

16 Claims, 13 Drawing Sheets

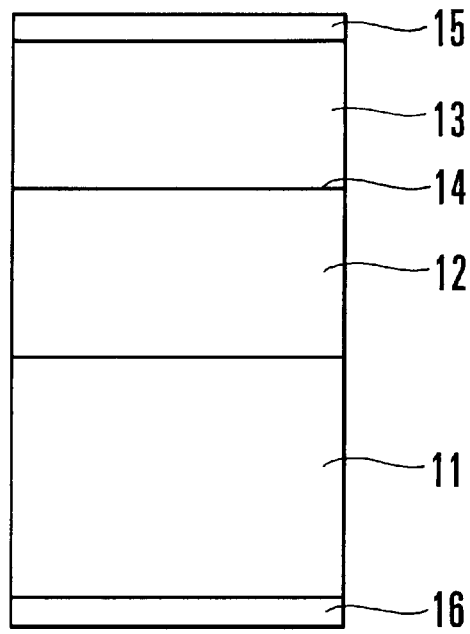
F I G. 1
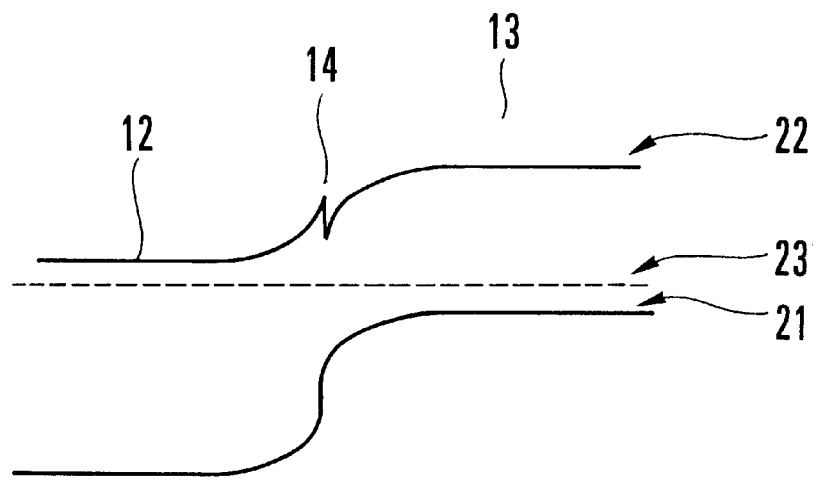
F I G. 2

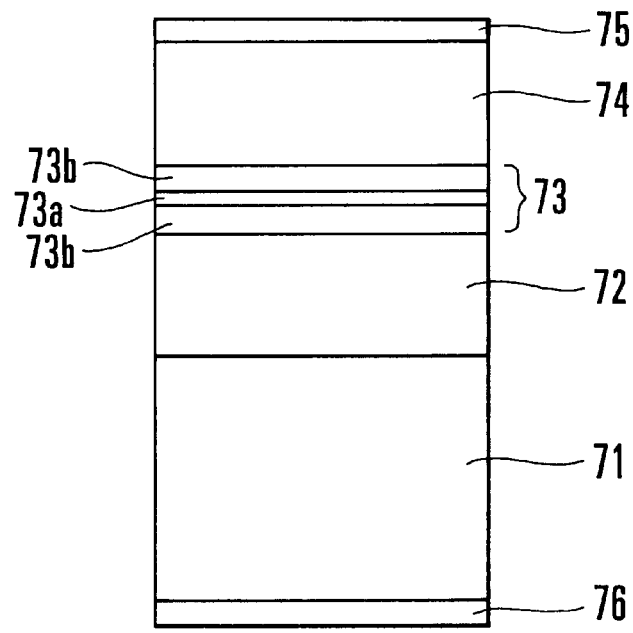
F I G. 7
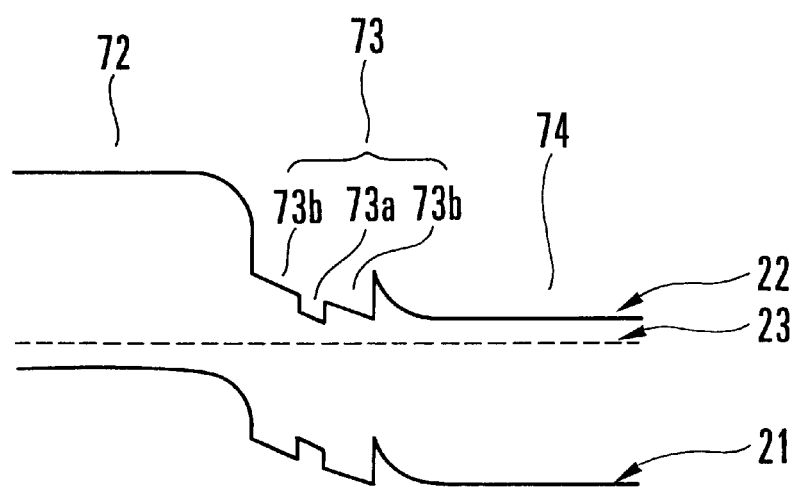
F I G. 8

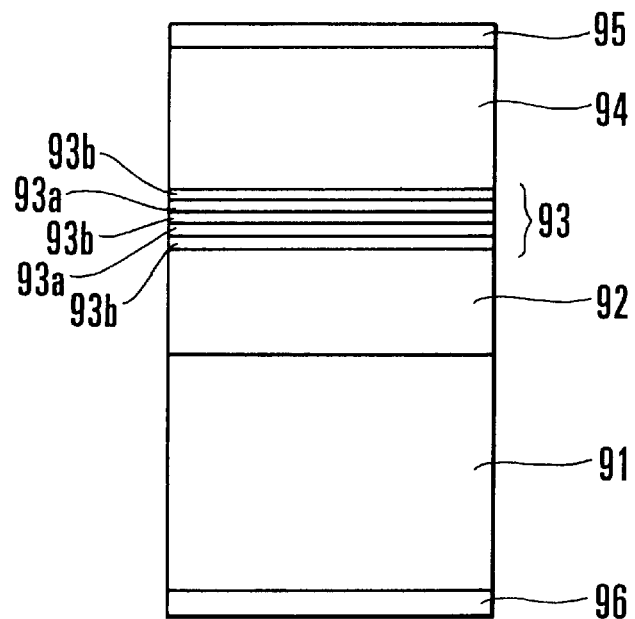
F I G. 9
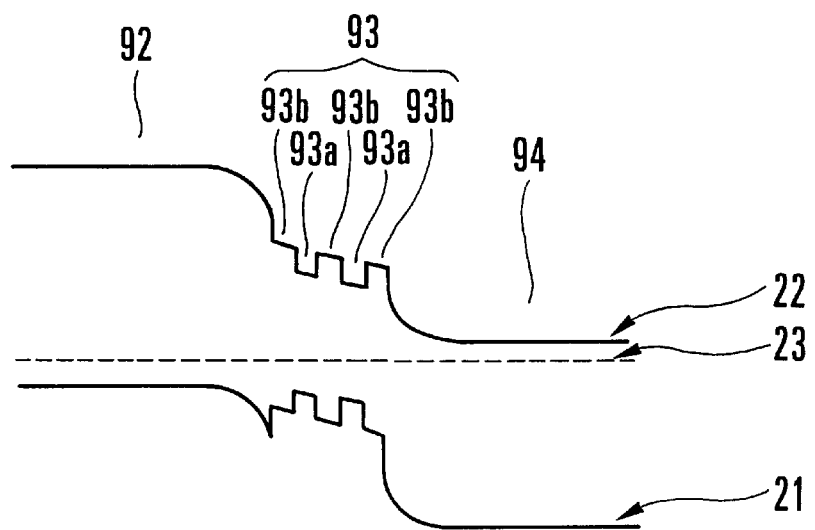
F I G. 10

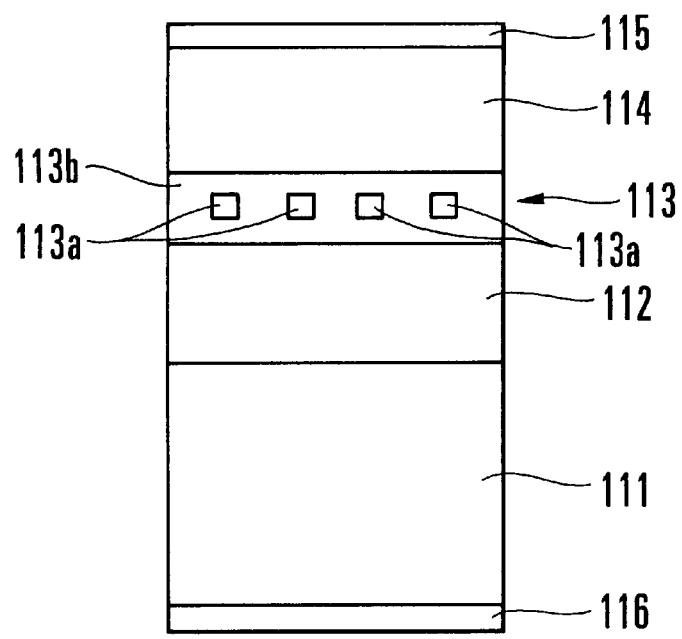
F I G. 11
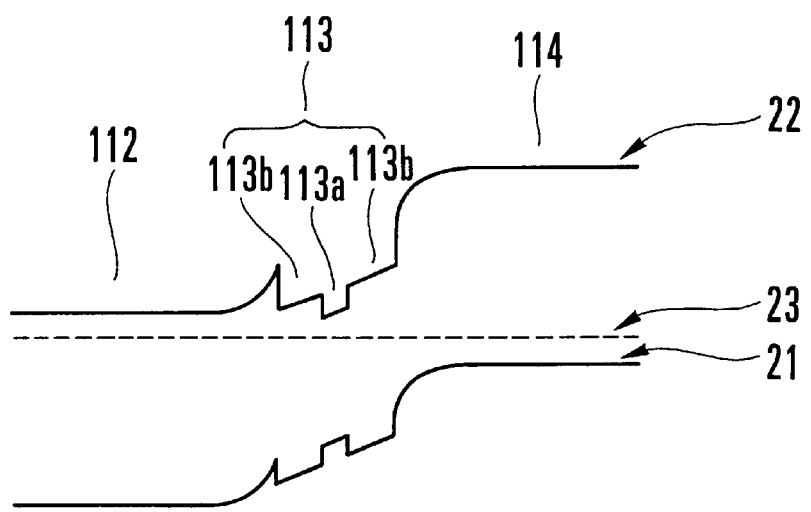
F I G. 12

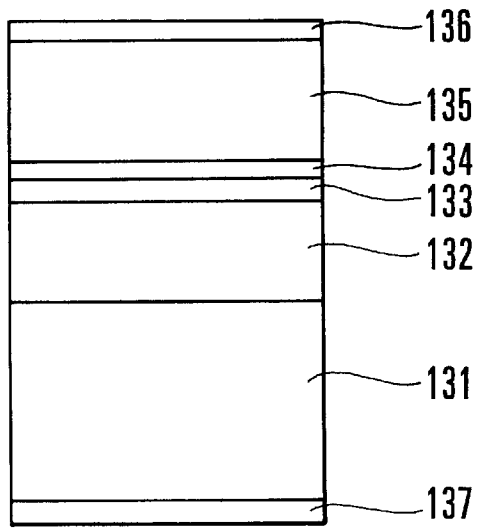
F I G. 13
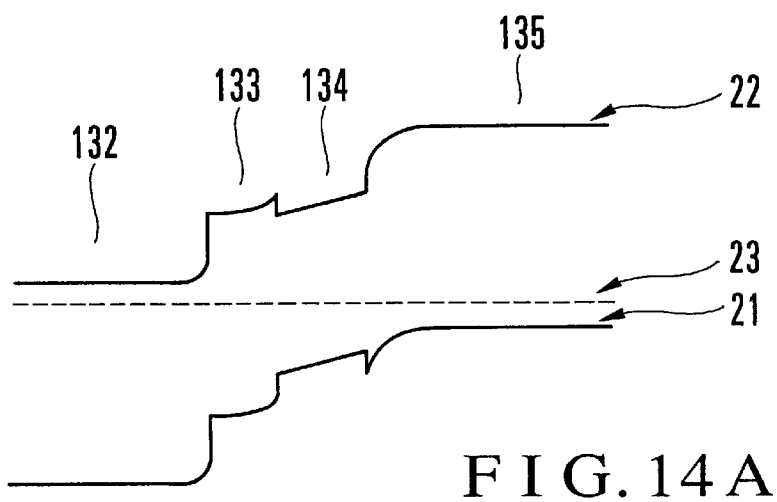
F I G. 14A
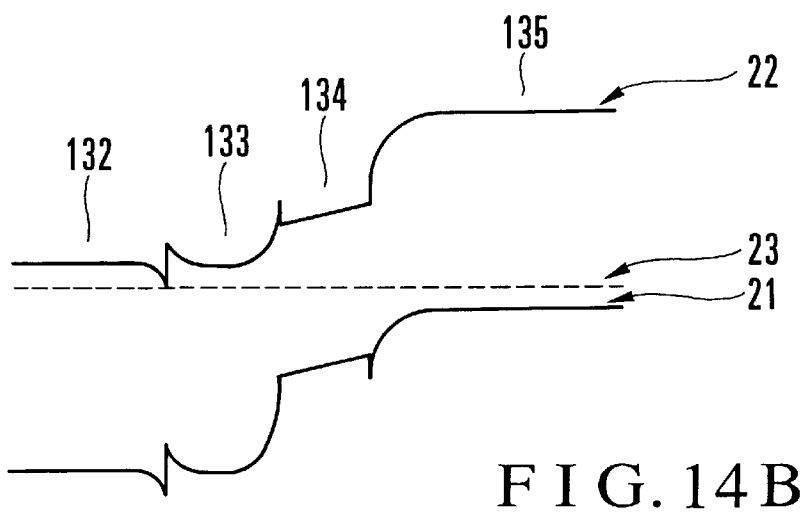
F I G. 14B

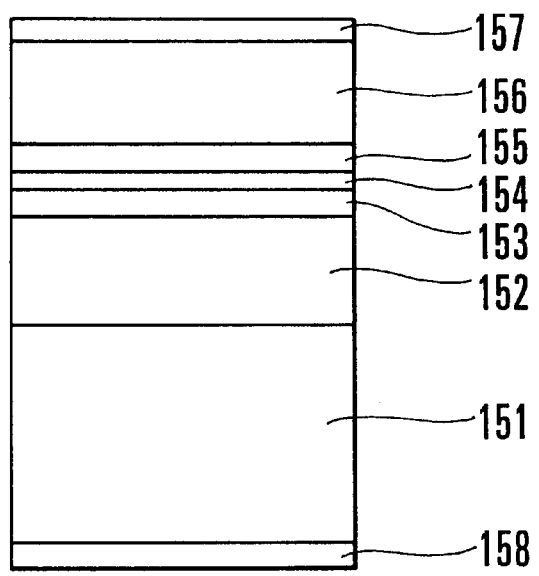
F I G. 15
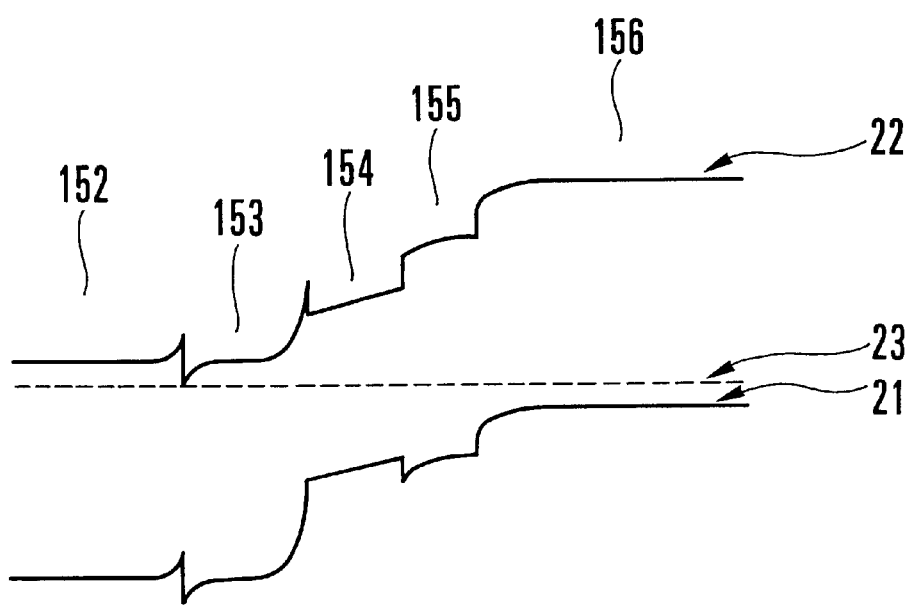
F I G. 16

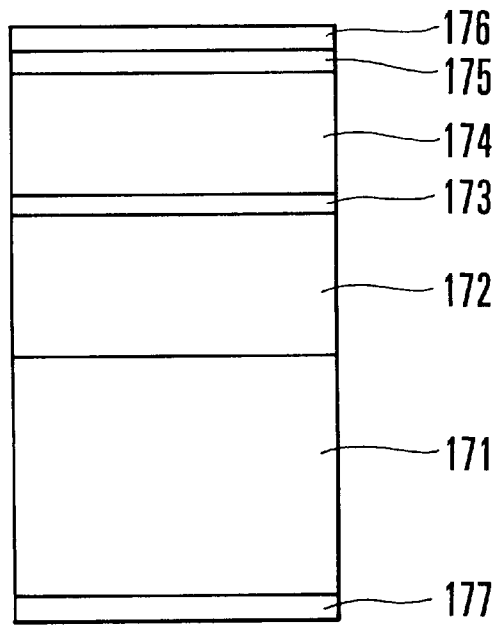
F I G. 17
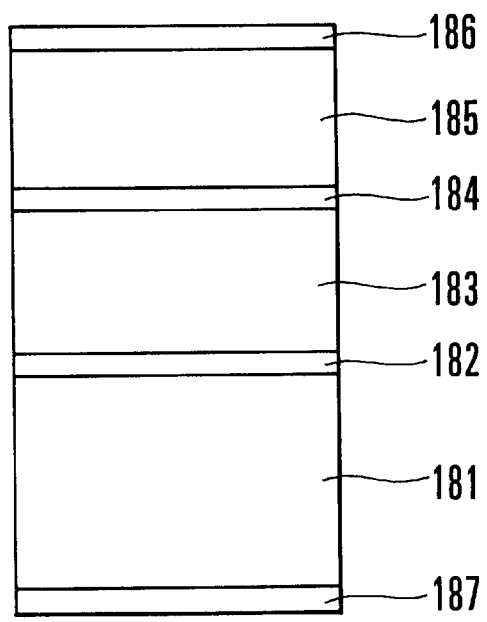
F I G. 18

II-VI COMPOUND SEMICONDUCTOR LIGHT EMITTING DEVICE

BACKGROUND OF THE INVENTION

The present invention relates to a II–VI compound semiconductor light emitting device and, more particularly, to a visible light emitting diode and a laser diode.

In conventional group II–VI light emitting devices formed on an InP substrate, as disclosed in Japanese Patent Laid-Open Nos. 2-125477 and 5-21892, to efficiently emit light by injection of a current a double hetero structure is formed by using a ZnCdSeTe, MgZnCdSe, or MgZnSSe mixed crystal in a clad layer. Also, as disclosed in Japanese Patent Laid-Open No. 7-94832, a ZnCdSe mixed crystal is used to decrease the resistance of a p-type electrode.

Unfortunately, these conventional II–VI light emitting devices have a large device resistance and a low light emission efficiency. This is so because the band gap of a ZnCdSeTe mixed crystal is not so large as to strongly confine carriers. Also, p-type doping for ZnCdSe, MgZnCdSe, or MgZnSSe mixed crystals are difficult. Consequently, the hole concentration cannot be increased to $1 \times 10^{17}$ cm$^{-3}$ or more.

SUMMARY OF THE INVENTION

It is an object of the present invention to provide a light emitting device having a small device resistance and an increased light emission efficiency.

To achieve the above object of the present invention, there is provided a semiconductor light emitting device having a stacked structure comprising an n-type clad layer, an active layer, and a p-type clad layer on an InP substrate, wherein the p-type clad layer is made from an MgZnSeTe-based compound semiconductor lattice-matched with InP, and the n-type clad layer is made from a compound semiconductor lattice-matched with InP and selected from the group consisting of an MgZnSeTe-based compound semiconductor, an MgZnCdSe-based compound semiconductor, and an MgCdSSe-based compound semiconductor.

BRIEF DESCRIPTION OF THE DRAWINGS

FIG. 1 is a view showing the structure of a light emitting diode according to the first embodiment of the present invention;

FIG. 2 is a band diagram of the light emitting diode shown in FIG. 1;

FIG. 7 is a view showing the structure of a semiconductor laser according to the fourth embodiment of the present invention;

FIG. 8 is a band diagram of the semiconductor laser shown in FIG. 7;

FIG. 9 is a view showing the structure of a light emitting diode according to the fifth embodiment of the present invention;

FIG. 10 is a band diagram of the light emitting diode shown in FIG. 9;

FIG. 11 is a view showing the structure of a light emitting diode according to the sixth embodiment of the present invention;

FIG. 12 is a band diagram of the light emitting diode shown in FIG. 11;

FIG. 13 is a view showing the structure of a light emitting diode according to the seventh embodiment of the present invention;

FIGS. 14A and 14B are band diagrams of the light emitting diode shown in FIG. 13;

FIG. 15 is a view showing the structure of a light emitting diode according to the eighth embodiment of the present invention;

FIG. 16 is a band diagram of the light emitting diode shown in FIG. 15;

FIG. 17 is a view showing the structure of a semiconductor laser according to the ninth embodiment of the present invention;

FIG. 18 is a view showing the structure of a semiconductor laser according to the 10th embodiment of the present invention;

DESCRIPTION OF THE PREFERRED EMBODIMENTS

Figure 3:
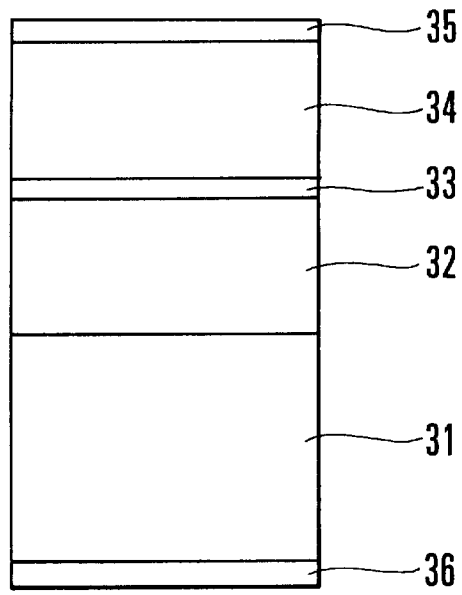
FIG. 3 is a view showing the structure of a semiconductor laser according to the second embodiment of the present invention.

The present invention will be described in detail below with reference to the accompanying drawings.

[First Embodiment]

FIG. 1 shows a light emitting diode according to the first embodiment of the present invention. Referring to FIG. 1, an n-type clad layer 12, a p-type clad layer 13, and a p-type electrode 15 are formed in this order on the surface of a n-type InP substrate 11. The n-type clad layer 12 is made from n-type MgZnSeTe lattice-matched with InP. The p-type clad layer 13 is made from p-type MgZnSeTe lattice-matched with InP. The p-type electrode 15 is made from a metal. A p-n junction 14 is formed in the interface between the n-type clad layer 12 and the p-type clad layer 13. This p-n junction 14 and its vicinity function as an active layer.

An n-type electrode 16 is formed on the back surface of the InP substrate 11. A semiconductor layer including the n-type clad layer 12 and the p-type clad layer 13 is formed by MOVPE (Metal Organic Vapor-Phase Epitaxy) or MBE (Molecular Beam Epitaxy). The p-type electrode 15 and the n-type electrode 16 are formed by vacuum vapor deposition or the like.

$Mg_xZn_{1-x}Se_yTe_{1-y}$ mixed crystals can be lattice-matched with InP when the Mg composition is within the range of $0 \leq x \leq 0.94$. As the Mg composition increases, the band gap increases. To obtain a p-type mixed crystal, it is only necessary to dope a group V element such as nitrogen (N), phosphorus (P), or arsenic (As). Consequently, a p-type carrier concentration of $1 \times 10^{17}$ cm$^{-3}$ or more can be easily obtained. To obtain an n-type structure, it is only necessary to dope a group III element such as gallium (Ga), indium (In), or aluminum (Al). Consequently, an n-type carrier concentration of $1 \times 10^{17}$ cm$^{-3}$ or more can be easily obtained.

Also, the larger the Se composition, the higher the n-type carrier concentration; and the larger the Te composition, the higher the p-type carrier concentration. The mixed crystal compositions of the n-type clad layer 12 and the p-type clad layer 13 can be either equal or different.

FIG. 2 shows a typical band diagram of the light emitting diode shown in FIG. 1. When the n-type clad layer 12 and the p-type clad layer 13 have different mixed crystal compositions, a valence band edge 21 and a conduction band edge 22 discontinue in the p-n junction 14. When positive and negative voltages are applied to the p-type electrode 15 and the n-type electrode 16, respectively, a Fermi level 23 of the p-type clad layer 13 becomes lower than that of the n-type clad layer 12. Consequently, electrons and holes are injected into the p-n junction 14. Due to the effect of the diffusion potential in the p-n junction 14 and the effect of the band discontinuity of the valence band edge 21 and the conduction band edge 22, the electrons and holes recombine to emit light near the p-n junction 14. If this is the case, the p-n junction 14 and its vicinity function as an active layer. The obtained emission wavelength is 400 to 600 nm.

Since an MgZnSeTe mixed crystal which allows easy doping of n- and p-type impurities is used in the n-type clad layer 12 and the p-type clad layer 13, the device resistance lowers, and the reactive current not contributing to light emission reduces. Accordingly, a light emitting diode having a high light emission efficiency is obtained. Additionally, since the n-type clad layer 12 and the p-type clad layer 13 are lattice-matched with InP, high device reliability with few lattice defects is obtained.

In this embodiment, the p-n junction region is given the function of an active layer. However, a layer made from a ZnSeTe, MgZnSeTe, or MgZnCdSe mixed crystal or a layer having a composition or structure combining these mixed crystals can be formed between the n- and p-type clad layers and used as an active layer. Also, a carrier can be doped in the active layer. When light emission from a carrier level is used, light having a wavelength longer than 600 nm is obtained. Furthermore, although a light emitting diode is used as a light emitting device, other optical devices such as semiconductor lasers can also be used.

[Second Embodiment]

FIG. 3 shows the structure of a semiconductor laser according to the second embodiment of the present invention. Referring to FIG. 3, an n-type clad layer 32, an active layer 33, a p-type clad layer 34, and a p-type electrode 35 are formed in this order on the surface of a n-type InP substrate 31. The n-type clad layer 32 is made from n-type MgZnCdSe lattice-matched with InP. The active layer 33 is made from MgZnSeTe lattice-matched with InP or ZnCdSeTe lattice-matched with InP. The p-type clad layer 34 is made from p-type MgZnSeTe lattice-matched with InP. The p-type electrode 35 is made from a metal. An n-type electrode 36 is formed on the back surface of the InP substrate 31.

A semiconductor layer including the n-type clad layer 32, the active layer 33, and the p-type clad layer 34 is formed by MOVPE (Metal Organic Vapor-Phase Epitaxy) or MBE (Molecular Beam Epitaxy). The p-type electrode 35 and the n-type electrode 36 are formed by vacuum vapor deposition or the like. After the electrodes 35 and 36 are formed, a laser cavity mirror formed by cleavage.

$Mg_xZn_yCd_{1-x-y}Se$ mixed crystals can be lattice-matched with InP when the Mg composition is within the range of $0 \leq x \leq 0.9$. As the Mg composition increases, the band gap increases. $Zn_xCd_{1-x}Se_yTe_{1-y}$ mixed crystals can be lattice-matched with InP when the Zn composition is within the range of $0.48 \leq x \leq 1$. To obtain an n-type MgZnCdSe mixed crystal, it is only necessary to dope a group VII element such as chlorine (Cl) or a group III element such as gallium (Ga), indium (In), or aluminum (Al). Consequently, an n-type carrier concentration of $1 \times 10^{17}$ cm$^{-3}$ or more can be easily obtained. The band gap of the active layer 33 is smaller than those of the n-type clad layer 32 and the p-type clad layer 34.

Figure 4A:
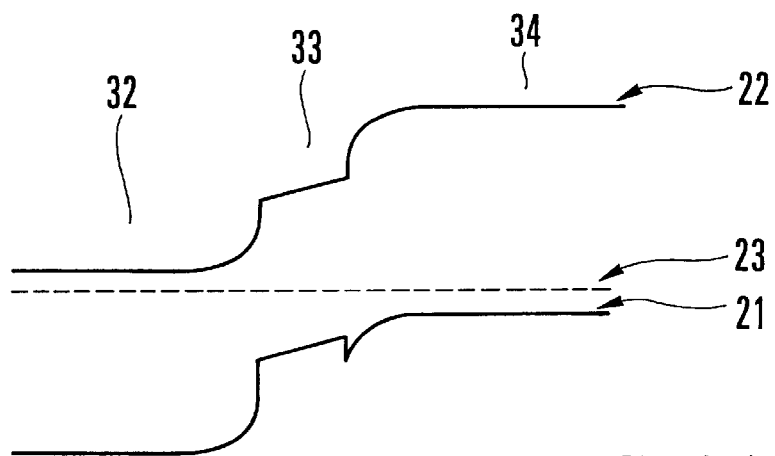
FIGS. 4A and 4B are band diagrams of the semiconductor laser shown in FIG. 3.
Figure 4B:
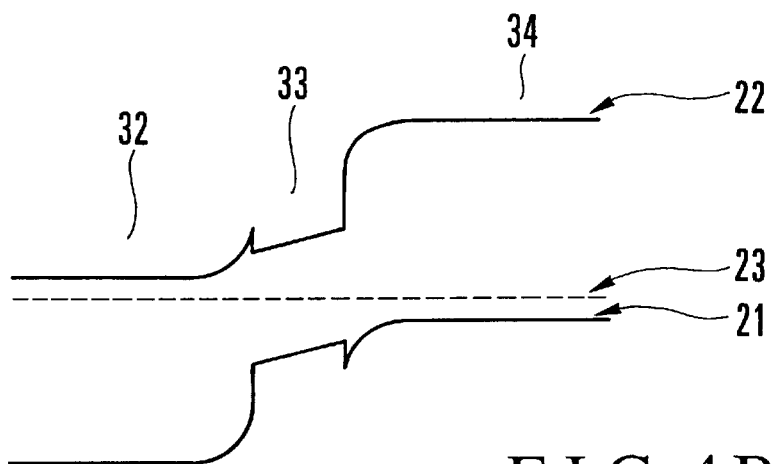

FIGS. 4A and 4B show typical band diagrams of the semiconductor laser shown in FIG. 3. MgZnCdSe and MgZnSeTe mixed crystals sometimes take a band lineup of type I depending upon the composition. Generally, however, the band lineup is so-called type II because both of the energy positions of a valence band edge 21 and a conduction band edge 22 are lower in MgZnCdSe mixed crystals. Accordingly, when the active layer 33 is made from an MgZnSeTe mixed crystal, as shown in FIG. 4A, the band discontinuity of the valence band edge 21 increases in the interface between the n-type clad layer 32 and the active layer 33. This enhances the hole confinement effect. Also, the band discontinuity of the conduction band edge 22 increases in the interface between the active layer 33 and the p-type clad layer 34. This enhances the electron confinement effect.

When the active layer 33 is made from a ZnCdSeTe mixed crystal, as shown in FIG. 4B, the energy position of the conduction band edge 22 is lower in the active layer 33 than in the n-type clad layer 32 and the p-type clad layer 34. The energy position of the valence band edge 21 is higher in the active layer 33 than in the n-type clad layer 32 and the p-type clad layer 34. Accordingly, the compositions of these layers can be so selected as to form a so-called type I band lineup. If this is the case, the active layer 33 functions like a well for both electrons and holes. Therefore, carriers are well confined in the active layer 33.

When positive and negative voltages are applied to the p-type electrode 35 and the n-type electrode 36, respectively, electrons and holes are injected into the active layer 33 and recombine to emit light. Since the electrons and holes are effectively confined in the active layer 33 by the effect of band discontinuity, a semiconductor laser having a high light emission efficiency is obtained. The obtained emission wavelength is 400 to 600 nm. The device resistance lowers because an MgZnCdSe mixed crystal which allows easy doping of an n-type carrier is used in the n-type clad layer 32 and an MgZnSeTe mixed crystal which allows easy doping of a p-type carrier is used in the p-type clad layer 34. Additionally, since the n-type clad layer 32, the active layer 33, and the p-type clad layer 34 are lattice-matched with InP, high device reliability with few lattice defects is obtained.

Also, common semiconductor lasers have a band lineup of type I. In the present invention, however, the light emission efficiency is high regardless of whether the band lineup is type I or type II.

In this embodiment, the active layer is made from a MgZnSeTe or ZnCdSeTe mixed crystal. However, a layer made from an MgZnCdSe or MgCdSSe mixed crystal or a layer having a composition or structure combining these mixed crystals can be formed. Also, a carrier can be doped in the active layer. Alternatively, a p-n junction can be used in place of the active layer. Furthermore, although a semiconductor laser is used as a light emitting device, other optical devices such as light emitting diodes can also be used.

[Third Embodiment]

Figure 5:
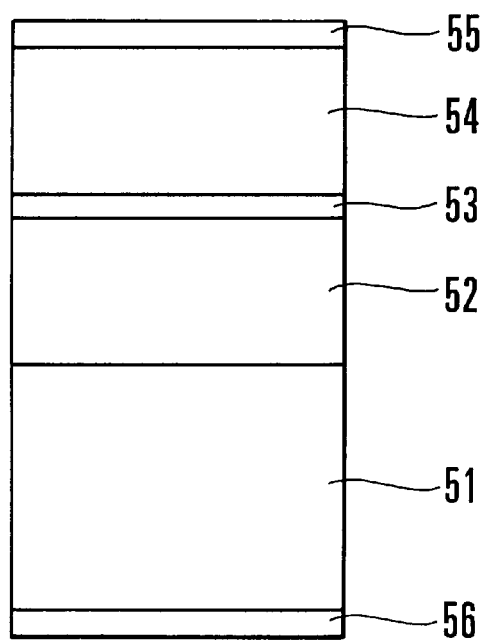
FIG. 5 is a view showing the structure of a semiconductor laser according to the third embodiment of the present invention.

FIG. 5 shows the structure of a semiconductor laser according to the third embodiment of the present invention. Referring to FIG. 5, a p-type clad layer 52, an active layer 53, an n-type clad layer 54, and an n-type electrode 55 are formed in this order on the surface of a p-type InP substrate 51. The p-type clad layer 52 is made from p-type MgZnSeTe lattice-matched with InP. The active layer 53 is made from MgZnCdSe lattice-matched with InP. The n-type clad layer 54 is made from n-type MgCdSSe lattice-matched with InP. The n-type electrode 55 is made from a metal. A p-type electrode 56 is formed on the back surface of the InP substrate 51.

A semiconductor layer is formed by MOVPE (Metal Organic Vapor-Phase Epitaxy) or MBE (Molecular Beam Epitaxy). The n-type electrode 55 and the p-type electrode 56 are formed by vacuum vapor deposition or the like. After the electrodes 55 and 56 are formed, a laser cality mirror is formed by cleavage.

$Mg_xCd_{1-x}S_ySe_{1-y}$ mixed crystals can be lattice-matched with InP when the Mg composition is within the range of $0 \leq x \leq 1$. As the Mg composition increases, the band gap increases. To obtain an n-type mixed crystal, it is only necessary to dope a group VII element such as chlorine (Cl) or a group III element such as gallium (Ga), indium (In), or aluminum (Al). Consequently, a p-type carrier concentration of $1 \times 10^{17}$ cm$^{-3}$ or more can be easily obtained. The band gap of the active layer 53 is smaller than those of the p-type clad layer 52 and the n-type clad layer 54.

Figure 6:
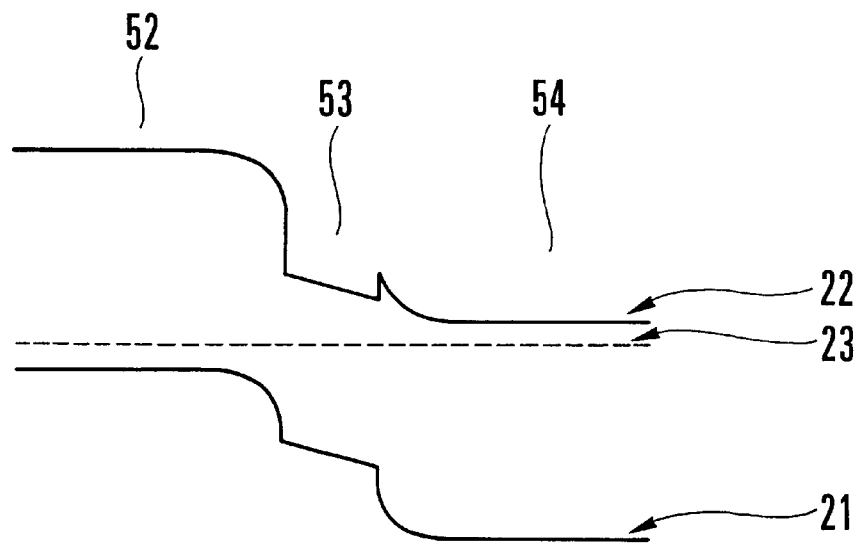
FIG. 6 is a band diagram of the semiconductor laser shown in FIG. 5.

FIG. 6 shows a typical band diagram of the semiconductor laser shown in FIG. 5. MgCdSSe and MgZnSeTe mixed crystals can take a band lineup of type I depending upon the composition. Generally, however, the band lineup is so-called type II because both of the energy positions of a valence band edge 21 and a conduction band edge 22 are lower in MgCdSSe mixed crystals. Accordingly, when the active layer 53 is made from an MgZnCdSe mixed crystal, the band discontinuity of the valence band edge 21 increases in the interface between the p-type clad layer 52 and the active layer 53. This enhances the electron confinement effect. Also, the band discontinuity of the conduction band edge 22 increases in the interface between the active layer 53 and the n-type clad layer 54. This enhances the hole confinement effect.

When positive and negative voltages are applied to the p-type electrode 56 and the n-type electrode 55, respectively, electrons and holes are injected into active layer 53 and recombine to emit light. Since the electrons and holes are effectively confined in the active layer 53 by the effect of band discontinuity, a semiconductor laser having a high light emission efficiency is obtained. The obtained emission wavelength is 400 to 600 nm. The device resistance lowers because an MgCdSSe mixed crystal which allows easy doping of an n-type carrier is used in the n-type clad layer 54 and an MgZnSeTe mixed crystal which allows easy doping of a p-type carrier is used in the p-type clad layer 52. Additionally, since the p-type clad layer 52, the active layer 53, and the n-type clad layer 54 are lattice-matched with InP, high device reliability with few lattice defects is obtained.

In this embodiment, the active layer is made from an MgZnCdSe mixed crystal. However, a layer made from a mixed crystal such as MgZnSeTe or MgCdSSe or a layer having a composition or structure combining these mixed crystals can be formed. Also, a carrier can be doped in the active layer. Alternatively, a p-n junction can be used in place of the active layer. Furthermore, although a semiconductor laser is used as a light emitting device, other optical devices such as light emitting diodes can also be used.

[Fourth Embodiment]

FIG. 7 shows the structure of a semiconductor laser according to the fourth embodiment of the present invention. Referring to FIG. 7, a p-type clad layer 72, an active layer 73, an n-type clad layer 74, and an n-type electrode 75 are formed in this order on the surface of a p-type InP substrate 71. The p-type clad layer 72 is made from p-type MgZnSeTe lattice-matched with InP. The active layer 53 has a single quantum well structure including an MgZnCdSe mixed crystal well layer 73a lattice-matched with InP and barrier layers 73b. The n-type clad layer 74 is made from n-type MgZnSeTe lattice-matched with InP. The n-type electrode 75 is made from a metal. A p-type electrode 76 is formed on the back surface of the InP substrate 51. After the electrodes 55 and 56 are formed, a laser cavity mirror is formed by cleavage.

FIG. 8 shows a typical band diagram of the semiconductor laser shown in FIG. 7. When positive and negative voltages are applied to the p-type electrode 76 and the n-type electrode 75, respectively, electrons and holes are injected into the well layer 73a in the active layer 73 and recombine to emit light. MgZnCdSe and MgZnSeTe mixed crystals generally have a band lineup of so-called type II. Since the band discontinuity of a conduction band edge 22 between the barrier layer 73b and the p-type clad layer 72 is large, diffusion of electrons into the p-type clad layer 72 reduces, and this decreases the lasing threshold current. The MgZnCdSe mixed crystal forming the active layer 73 takes a band lineup of so-called type I when the Mg composition is changed.

Both electrons and holes are confined in the well layer 73a of the quantum well structure, and the density of state becomes two-dimensional. Since the radiative recombination rate is increased by the quantum effect, a semiconductor laser having a high light emission efficiency is obtained. The obtained emission wavelength is 400 to 600 nm. The device resistance lowers because an MgZnSeTe mixed crystal which allows easy doping of n- and p-type impurities is used in the p-type clad layer 72 and the n-type clad layer 74. Additionally, since the p-type clad layer 72, the active layer 73, and the n-type clad layer 74 lattice-match with InP, high device reliability with few lattice defects is obtained.

In this embodiment, the active layer has an MgZnCdSe-based single quantum well structure. However, it is also possible to use a multiple quantum well structure or a single-layered structure which is not a quantum well. Quantum wires, quantum dots, or a strained quantum well structure is similarly usable. Also, a carrier can be doped in the active layer. Additionally, an MgZnSeTe mixed crystal is used in the n-type clad layer, but an MgZnCdSe or MgCdSSe mixed crystal can be similarly used. Furthermore, although a semiconductor laser is used as a light emitting device, other optical devices such as light emitting diodes can also be used.

[Fifth Embodiment]

FIG. 9 shows the structure of a semiconductor laser according to the fifth embodiment of the present invention.

Referring to FIG. 9, a p-type clad layer 92, an active layer 93, an n-type clad layer 94, and an n-type electrode 95 are formed in this order on the surface of a p-type InP substrate 91. The p-type clad layer 92 is made from p-type MgZnSeTe lattice-matched with InP. The active layer 93 has a multiple quantum well structure including MgZnSeTe mixed crystal well layers 93a lattice-matched with InP and barrier layers 93b. The n-type clad layer 94 is made from n-type MgCdSSe lattice-matched with InP. The n-type electrode 95 is made from a metal. A p-type electrode 96 is formed on the back surface of the InP substrate 91.

FIG. 10 shows a typical band diagram of the semiconductor laser shown in FIG. 9. When positive and negative voltages are applied to the p-type electrode 96 and the n-type electrode 95, respectively, electrons and holes are injected into the well layers 93a in the active layer 93 and recombine to emit light. MgZnCdSe and MgZnSeTe mixed crystals generally have a band lineup of so-called type II. Since the band discontinuity of a valence band edge 21 between the barrier layer 93b and the n-type clad layer 94 is large, diffusion of electrons into the n-type clad layer 94 reduces, and this decreases the oscillation threshold current. The MgZnSeTe mixed crystal forming the active layer 93 takes a band lineup of so-called type I when the Mg composition is changed.

Accordingly, both electrons and holes are confined in the well layers 93a of the quantum well structure, and the density of state becomes two-dimensional. Since the radiative recombination rate is increased by the quantum effect, a semiconductor laser having a high light emission efficiency is obtained. The obtained emission wavelength is 400 to 600 nm. The device resistance lowers because an MgZnSeTe mixed crystal which allows easy doping of a p-type carrier is used in the p-type clad layer 92 and an MgCdSSe mixed crystal which allows easy doping of an n-type carrier is used in the n-type clad layer 94. Additionally, since the p-type clad layer 92, the active layer 93, and the n-type clad layer 94 are lattice-matched with InP, high device reliability with few lattice defects is obtained.

In this embodiment, the active layer has an MgZnSeTe-based multiple quantum well structure. However, it is also possible to use a single quantum well structure or a single-layered structure which is not a quantum well. Quantum wires, quantum dots, or a strained quantum well structure is similarly usable. Also, a carrier can be doped in the active layer. Additionally, an MgCdSSe mixed crystal is used in the n-type clad layer, but an MgZnSeTe or MgZnCdSe mixed crystal can be similarly used. Furthermore, although a semiconductor laser is used as a light emitting device, other optical devices such as light emitting diodes can also be used.

[Sixth Embodiment]

FIG. 11 shows the structure of a light emitting diode according to the sixth embodiment of the present invention. Referring to FIG. 11, an n-type clad layer 112, an active layer 113, a p-type clad layer 114, and a p-type electrode 115 are formed in this order on the surface of an n-type InP substrate 111. The n-type clad layer 112 is made from n-type MgZnCdSe lattice-matched with InP. The active layer 113 has quantum wire structures including MgZnSeTe mixed crystal well layers 113a lattice-matched with InP and a barrier layer 113b. The p-type clad layer 114 is made from p-type MgZnSeTe lattice-matched with InP. The p-type electrode 115 is made from a metal. An n-type electrode 116 is formed on the back surface of the InP substrate 111.

FIG. 12 shows a typical band diagram of the light emitting diode shown in FIG. 11. When positive and negative voltages are applied to the p-type electrode 115 and the n-type electrode 116, respectively, electrons and holes are injected into the well layer 113a in the active layer 113 and recombine to emit light. MgCdSSe and MgZnSeTe mixed crystals generally have a band lineup of so-called type II. Therefore, the band discontinuity of a conduction band edge 22 between the barrier layer 113b and the p-type clad layer 114 is large. Consequently, diffusion of electrons into the n-type clad layer 114 reduces, and this decreases the lasing threshold current. The MgCdSSe mixed crystal forming the active layer 113 takes a band lineup of so-called type I when the Mg composition is changed.

Both electrons and holes are confined in the well layer 113a of the quantum wire structure, and the density of state becomes one-dimensional. Since the radiative recombination rate is increased by the quantum effect, a light emitting diode having a high light emission efficiency is obtained. The obtained emission wavelength is 400 to 600 nm. The device resistance lowers because an MgCdSSe mixed crystal which allows easy doping of an n-type carrier is used in the n-type clad layer 112 and an MgZnSeTe mixed crystal which allows easy doping of a p-type carrier is used in the p-type clad layer 114. Additionally, since the n-type clad layer 112, the active layer 113, and the p-type clad layer 114 are lattice-matched with InP, high device reliability with few lattice defects is obtained.

In this embodiment, the active layer has an MgCdSSe-based quantum wire structure. However, it is also possible to use a single quantum well structure, a multiple quantum well structure, or a single-layered structure which is not a quantum well. Quantum dots or a strained quantum well structure is similarly usable. Also, a carrier can be doped in the active layer. Additionally, an MgZnCdSe mixed crystal is used in the n-type clad layer, but an MgZnSeTe or MgCdSSe mixed crystal can be similarly used. Furthermore, although a light emitting diode is used as a light emitting deivce, other optical devices such as semiconductor lasers can also be used.

[Seventh Embodiment]

FIG. 13 shows the structure of a light emitting diode according to the seventh embodiment of the present invention. Referring to FIG. 13, an n-type clad layer 132, an n-side light guide layer 133, an active layer 134, a p-type clad layer 135, and a p-type electrode 136 are formed in this order on the surface of an n-type InP substrate 131. The n-type clad layer 132 is made from n-type MgZnCdSe lattice-matched with InP. The n-side light guide layer 133 is made from n-type MgZnSeTe lattice-matched with InP. The active layer 134 is made from MgZnSeTe lattice-matched with InP. The p-type clad layer 135 is made from p-type MgZnSeTe lattice-matched with InP. The p-type electrode 136 is made from a metal. An n-type electrode 137 is formed on the back surface of the InP substrate 131.

The n-side light guide layer 133 has a larger band gap than that of the active layer 134 and a thickness of 300 nm or less. The band diagram changes in accordance with the thickness of the n-side light guide layer 133 and the extension of the n-side depletion layer. FIG. 14A shows a band diagram when the thickness of the n-side light guide layer 133 is smaller than the extension of the n-side depletion layer. If this is the case, the n-side light guide layer 133 is completely depleted, and a portion of the n-type clad layer 132 is also depleted. FIG. 14B shows a band diagram when the thickness of the n-side light guide layer 133 is larger than the extension of the n-side depletion layer. If this is the case, n-side depletion extends to the middle of the n-side light guide layer 133, and a small amount of electrons are two-dimensionally stored in the interface between the n-side light guide layer 133 and the n-type clad layer 132.

Since the n-side light guide layer 133 is inserted, this n-side light guide layer 133, the active layer 134, and the p-type clad layer 135 form a double hetero structure generally used in a semiconductor laser. As a consequence, the carrier confinement effect is enhanced, and this increases the light emission efficiency. Also, the light confinement ratio can be adjusted by properly selecting the refractive index of the n-side light guide layer 133. The n-side light guide layer 133 is thinner than the n-type clad layer 132. Therefore, the device resistance does not greatly increase even if the doping concentration is low. The device resistance lowers because an MgZnCdSe mixed crystal which allows easy doping of an n-type carrier is used in the thick n-type clad layer 132.

In this embodiment, the n-side light guide layer is made from an n-type MgZnSeTe mixed crystal. However, it is also possible to use a layer made from a mixed crystal such as MgZnCdSe or MgCdSSe or a layer having a composition or structure combining these mixed crystals. The n-side light guide layer need only be n-type doped or undoped. Additionally, an MgZnCdSe mixed crystal is used in the n-type clad layer, but a mixed crystal such as MgZnSeTe or MgCdSSe can be similarly used. Likewise, a mixed crystal such as MgZnCdSe or MgCdSSe, instead of MgZnSeTe, can be used in the active layer. Furthermore, although a light emitting diode is used as a light emitting device, other optical devices such as semiconductor lasers can also be used.

[Eighth Embodiment]

FIG. 15 shows the structure of a light emitting diode according to the eighth embodiment of the present invention. Referring to FIG. 15, an n-type clad layer 152, an n-side light guide layer 153, an active layer 154, a p-side light guide layer 155, a p-type clad layer 156, and a p-type electrode 157 are formed in this order on the surface of an n-type InP substrate 151. The n-type clad layer 152 is made from n-type MgZnCdSe lattice-matched with InP. The n-side light guide layer 153 is made from n-type MgCdSSe lattice-matched with InP. The active layer 154 is made from MgCdSSe lattice-matched with InP. The p-side light guide layer 155 is made from MgCdSSe lattice-matched with InP. The p-type clad layer 156 is made from p-type MgZnSeTe lattice-matched with InP. The p-type electrode 157 is made from a metal. An n-type electrode 158 is formed on the back surface of the InP substrate 151.

The n-side light guide layer 153 and the p-side light guide layer 155 have larger band gaps than that of the active layer 154 and thicknesses of 300 nm or less. The band diagram changes in accordance with the thicknesses of the n-side light guide layer 133 and the p-side light guide layer 135 and the extensions of p-n junction depletion layers. FIG. 16 shows a band diagram when the thickness of the n-side light guide layer 153 is larger than the extension of the n-side depletion layer and the thickness of the p-side light guide layer 155 is smaller than the extension of the p-side depletion layer. If this is the case, n-side depletion extends to the middle of the n-side light guide layer 153, and a small amount of electrons are two-dimensionally stored in the interface between the n-side light guide layer 153 and the n-type clad layer 152. The p-side light guide layer 155 is completely depleted, and a portion of the p-type clad layer 156 is also depleted.

Since the n-side light guide layer 153 and the p-side light guide layer 155 are inserted, the n-side light guide layer 153, the active layer 154, and the p-side light guide layer 155 form a double hetero structure generally used in a semiconductor laser. As a consequence, the carrier confinement effect is enhanced, and this increases the light emission efficiency. Also, the light confinement ratio can be adjusted by properly selecting the refractive indices of the n-side light guide layer 153 and the p-side light guide layer 155.

The n-side light guide layer 153 and the p-side light guide layer 155 are as thin as 300 nm or less. Hence, the device resistance does not greatly increase even if the doping concentration is low. The device resistance lowers because MgZnCdSe and MgZnSeTe mixed crystals which allow easy doping of impurities are used in the thick n-type and p-type clad layers 152 and 156, respectively.

In this embodiment, the n-side light guide layer, the active layer, and the p-side light guide layer are made from an MgCdSSe mixed crystal. However, it is also possible to use a layer made from a mixed crystal such as MgZnCdSe or MgCdSeTe or a layer having a composition or structure combining these mixed crystals. The n-side light guide layer can be n-type doped or undoped. The p-side light guide layer can be p-type doped or undoped. The n-side light guide layer, the active layer, and the p-side light guide layer can be made from different materials. Also, one of the n-side light guide layer and the p-side light guide layer can be omitted.

Additionally, an MgZnCdSe mixed crystal is used in the n-type clad layer, but a mixed crystal such as MgZnSeTe or MgCdSSe can be similarly used. Furthermore, although a light emitting diode is used as a light emitting device, other optical devices such as semiconductor lasers can also be used.

[Ninth Embodiment]

FIG. 17 shows the structure of a semiconductor laser according to the ninth embodiment of the present invention. Referring to FIG. 17, an n-type clad layer 172, an active layer 173, a p-type clad layer 174, a p-type contact layer 175, and a p-type electrode 176 are formed in this order on the surface of an n-type InP substrate 171. The n-type clad layer 172 is made from n-type MgZnCdSe lattice-matched with InP. The active layer 173 is made from MgZnSeTe lattice-matched with InP. The p-type clad layer 174 is made from p-type MgZnSeTe lattice-matched with InP. The p-type contact layer 175 is made from p-type MgZnSeTe lattice-matched with InP. The p-type electrode 176 is made from a metal. An n-type electrode 177 is formed on the back surface of the InP substrate 171.

P-type MgZnSeTe mixed crystals decrease the electrode resistance as the Mg composition decreases. By inserting the p-type contact layer 175 having a smaller Mg composition than the p-type clad layer 174 and a p-type carrier concentration of $1 \times 10^{18}$ cm$^{-3}$ or more, the electrode resistance reduces, and the operating voltage of the semiconductor laser decreases. Since the p-type contact layer 175 is lattice-matched with InP, high device reliability with few lattice defects is obtained.

In this embodiment, the p-type contact layer is made from a single-layered MgZnSeTe mixed crystal. However, it is also possible to use an MgZnSeTe superlattice or a graded layer in which the Mg composition decreases toward the electrode. Additionally, the active layer is made from an MgZnSeTe mixed crystal, but a layer made from a mixed crystal of MgZnCdSe or MgCdSSe or a layer having a composition or structure combining these mixed crystals is also usable. Likewise, a mixed crystal such as MgZnSeTe or MgCdSSe, instead of MgZnCdSe, can be used in the n-type clad layer. Furthermore, although a semiconductor laser is used as a light emitting device, other optical devices such as light emitting diodes can also be used.

[10th Embodiment]

FIG. 18 shows the structure of a semiconductor laser according to the 10th embodiment of the present invention. Referring to FIG. 18, a p-type connecting layer 182, a p-type clad layer 183, an active layer 184, an n-type clad layer 185, and an n-type electrode 186 are formed in this order on the surface of a p-type InP substrate 181. The p-type connecting layer 182 is made from p-type MgZnSeTe lattice-matched with InP. The p-type clad layer 183 is made from p-type MgZnSeTe lattice-matched with InP. The active layer 184 is made from MgZnCdSe lattice-matched with InP. The n-type clad layer 185 is made from n-type MgCdSSe lattice-matched with InP. The n-type electrode 186 is made from a metal. A p-type electrode 187 is formed on the back surface of the InP substrate 181.

Figure 19:
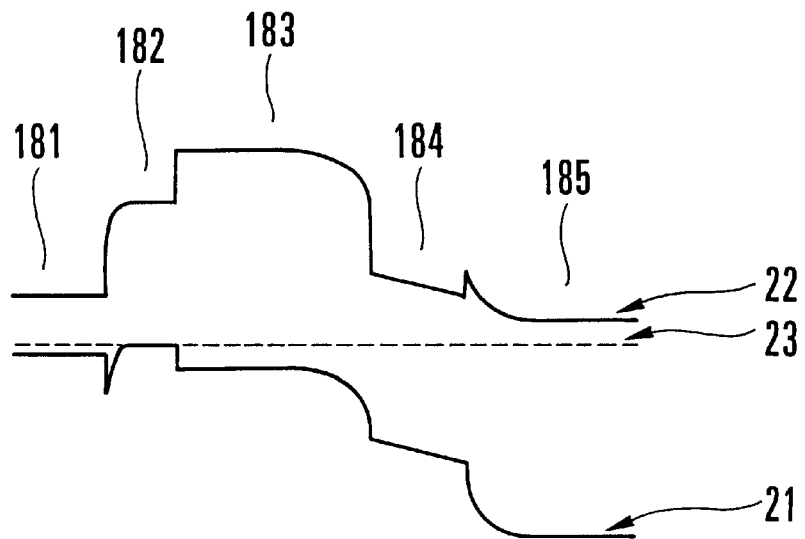
FIG. 19 is a band diagram of the semiconductor laser shown in FIG. 18.

The Mg composition of the p-type connecting layer 182 is smaller than the Mg composition of the p-type clad layer 183. Therefore, the energy position of a valence band edge 21 lowers in the order of the InP substrate 181, the p-type connecting layer 182, and the p-type clad layer 183. FIG. 19 shows a typical band diagram. Inserting the p-type connecting layer 182 decreases the band discontinuity of the valence band edge 21 in the interface between the InP substrate 181 and the p-type connecting layer 182 and in the interface between the p-type connecting layer 182 and the p-type clad layer 183. When the band discontinuity decreases, holes flow more easily, and the resistance in the interface decreases. As a consequence, the operating voltage of the semiconductor laser lowers, and its reliability increases.

In this embodiment, the p-type connecting layer is made from a single-layered MgZnSeTe mixed crystal. However, it is also possible to use an MgZnSeTe superlattice or a graded layer in which the Mg composition decreases toward the InP substrate. Additionally, the active layer is made from an MgZnCdSe mixed crystal, but a layer made from a mixed crystal of MgZnSeTe or MgCdSSe or a layer having a composition or structure combining these mixed crystals is similarly usable. Likewise, a mixed crystal such as MgZnSeTe or MgZnCdSe, instead of MgCdSSe, can be used in the n-type clad layer. Furthermore, although a semiconductor laser is used as a light emitting device, other optical devices such as light emitting diodes can also be used.

[11th Embodiment]

Figure 20:
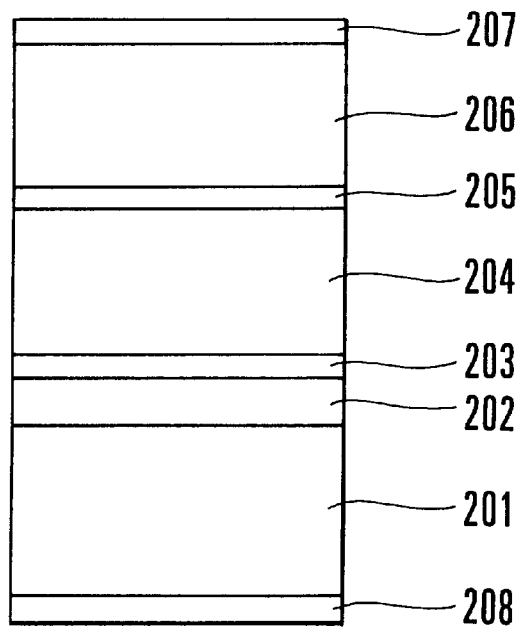
FIG. 20 is a view showing the structure of a semiconductor laser according to the 11th embodiment of the present invention.

FIG. 20 shows the structure of a semiconductor laser according to the 11th embodiment of the present invention. Referring to FIG. 20, a group III–V semiconductor buffer layer 202, a p-type connecting layer 203, a p-type clad layer 204, an active layer 205, an n-type clad layer 206, and an n-type electrode 207 are formed in this order on the surface of a p-type InP substrate 201. The group III–V semiconductor buffer layer 202 is made from p-type InGaAsP lattice-matched with InP. The p-type connecting layer 203 is made from p-type MgZnSeTe lattice-matched with InP. The p-type clad layer 204 is made from p-type MgZnSeTe lattice-matched with InP. The active layer 205 is made from MgZnCdSe lattice-matched with InP. The n-type clad layer 206 is made from n-type MgCdSSe lattice-matched with InP. The n-type electrode 207 is made from a metal. A p-type electrode 208 is formed on the back surface of the InP substrate 201.

When a semiconductor is epitaxially grown on the InP substrate 201, the oxide film on the surface is removed by heating. The surface from which the oxide film is removed is not flat on the atomic level. Additionally, P reevaporates to increase the ratio of In on the surface. If a II–VI compound semiconductor is directly grown on this InP substrate 201, crystal defects are readily formed. By inserting the group III–V semiconductor buffer layer 202, the crystal surface is planarized, and the composition ratio of group III elements to group V elements is controlled. This reduces crystal defects in the p-type connecting layer 203, the active layer 205, and the n-type clad layer 206 stacked on the group III–V semiconductor buffer layer 202. Consequently, a long lifetime semiconductor laser is obtained.

In this embodiment, the group III–V semiconductor buffer layer is made from a single-layered InGaAsP mixed crystal. However, it is also possible to use a layer of InP, InGaAsP, InGaAlAs, or InAlAsP or a superlattice of any of these compounds. The use of a superlattice promotes planarization. Also, in this embodiment a p-type group III–V semiconductor buffer layer is formed on a p-type InP substrate. However, an n-type III–V semiconductor buffer layer is formed when an n-type InP substrate is used. The p-connecting layer can be omitted.

Additionally, the active layer is made from an MgZnCdSe mixed crystal, but a layer made from a mixed crystal of MgZnSeTe or MgCdSSe or a layer having a composition or structure combining these mixed crystals is similarly usable. Likewise, a mixed crystal such as MgZnSeTe or MgZnCdSe, instead of MgCdSSe, can be used in the n-type clad layer. Furthermore, although a semiconductor laser is used as a light emitting deivce, other optical devices such as light emitting diodes can also be used.

[12th Embodiment]

Figure 21:
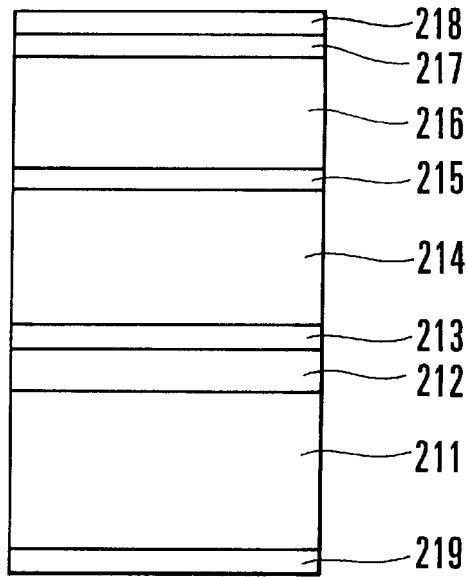
FIG. 21 is a view showing the structure of a semiconductor laser according to the 12th embodiment of the present invention.

FIG. 21 shows the structure of a semiconductor laser according to the 12th embodiment of the present invention. Referring to FIG. 21, a group III–V semiconductor buffer layer 212, a group II–VI semiconductor buffer layer 213, an n-type clad layer 214, an active layer 215, a p-type clad layer 216, a p-type contact layer 217, and a p-type electrode 218 are formed in this order on the surface of an n-type InP substrate 211. The group III–V semiconductor buffer layer 212 is made from n-type InP. The group II–VI semiconductor buffer layer 213 is made from CdS having a thickness of 100 nm or less. The n-type clad layer 214 is made from n-type MgZnCdSe lattice-matched with InP. The active layer 215 is made from MgZnSeTe lattice-matched with InP. The p-type clad layer 216 is made from p-type MgZnSeTe lattice-matched with InP. The p-type contact layer 217 is made from p-type MgZnSeTe lattice-matched with InP. The p-type electrode 218 is made from a metal. An n-type electrode 219 is formed on the back surface of the InP substrate 211.

The lattice length difference between CdS used in the group II–VI semiconductor buffer layer 213 and the InP substrate 211 is about 0.6%, and the critical film thickness is estimated to be about 15 nm. The crystal structure of CdS is a wurtzite structure. However, CdS takes a zinc blende structure when grown on zinc blende crystal.

When the II–VI semiconductor buffer layer 213 is not used, an n-type MgZnCdSe mixed crystal forming the n-type clad layer 214 is grown on the III–V semiconductor buffer layer 212. The sticking coefficient of Mg, Zn, Cd, and Se with respect to the group III–V semiconductor buffer layer 212 are largely different from those with respect to the group II–VI semiconductor layer. Accordingly, the composition of the MgZnCdSe mixed crystal is shifted. When the group II–VI semiconductor buffer layer 213 made from CdS is grown on the group III–V semiconductor buffer layer 212, Cd and S are always incorporated in a equal amounts. Consequently, a crystal having no composition variations is obtained.

On the group II–VI semiconductor buffer layer 213, the adhesion strengths of Mg, Zn, Cd, and Se are fixed. Therefore, an n-type clad layer 214 having a uniform composition is obtained. Inserting the group II–VI semiconductor buffer layer 213 eliminates variations in compositions of the n-type clad layer 214, the active layer 215, the p-type clad layer 216, and the p-type contact layer 217. Consequently, a semiconductor laser having high reliability and high reproducibility is obtained.

In this embodiment, the group II–VI semiconductor buffer layer is made from CdS whose thickness is equal to or smaller than the critical film thickness. However, MgSe whose thickness is equal to or smaller than the critical film thickness can also be used. Zn and Cd do not vary the adhesion strengths with respect to the group III–V semiconductor layer and the group II–VI semiconductor layer. Therefore, a ZnCdSe mixed crystal lattice-matched with InP can be used as the group II–VI semiconductor buffer layer. A multilayered structure of CdS, MgSe, and ZnCdSe can be similarly used instead of their single layers. Although n-type InP is used as the group III–V semiconductor buffer layer, it is also possible to use other group III–V semiconductors as the group II–V semiconductor buffer layer or omit the group III–V semiconductor buffer layer.

Additionally, the active layer is made from an MgZnSeTe mixed crystal, but a layer made from a mixed crystal of MgZnCdSe or MgCdSSe or a layer having a composition or structure combining these mixed crystals is similarly usable. Likewise, a mixed crystal such as MgZnSeTe or MgCdSSe, instead of MgZnCdSe, can be used in the n-type clad layer. Furthermore, although a semiconductor laser is used as a light emitting device, other optical devices such as light emitting diodes can also be used.

[13th Embodiment]

Figure 22:
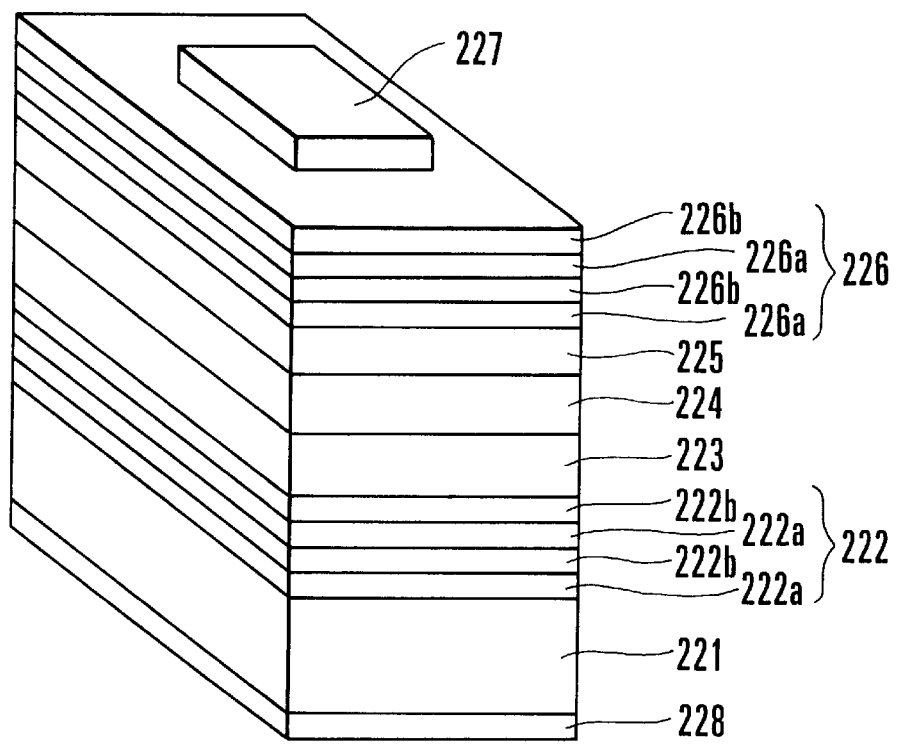
FIG. 22 is a perspective view showing a surface emission type semiconductor laser according to the 13th embodiment of the present invention.

FIG. 22 shows a surface emission type semiconductor laser according to the 13th embodiment. Referring to FIG. 22, an n-type multilayered film 222, an n-type clad layer 223, an active layer 224, a p-type clad layer 225, a p-type multilayered film 226, and a p-type electrode 227 are formed in this order on the surface of an n-type InP substrate 221. The n-type multilayered film 222 is formed by periodically stacking n-type $Mg_xZn_yCd_{1-x-y}Se$ layers 222a and n-type $Mg_sZn_tCd_{1-s-t}Se$ layers 222b each having a thickness ¼ the emission wavelength. The n-type clad layer 223 is made from n-type MgZnCdSe lattice-matched with InP. The active layer 224 is made from MgZnCdSe lattice-matched with InP. The p-type clad layer 225 is made from p-type MgZnSeTe lattice-matched with InP. The p-type multilayered film 226 is formed by periodically stacking p-type $Mg_hZn_{1-h}Se_iTe_{1-i}$ layers 226a and p-type $Mg_jZn_{1-j}Se_kTe_{1-k}$ layers 226b each having a thickness ¼ the emission wavelength. The p-type electrode 227 is a transparent electrode. An n-type electrode 228 made from a metal is formed on the back surface of the InP substrate 221.

All of the n-type $Mg_xZn_yCd_{1-x-y}Se$ layers 222a, n-type $Mg_sZn_tCd_{1-s-t}Se$ layers 222b, p-type $Mg_hZn_{i-h}Se_iTe_{1-i}$ layers 226a, and p-type MgjZnl layers 226b are lattice-matched with the InP substrate 221.

The reflectance of the n-type multilayered film 222 is increased by making an Mg composition s of the n-type $Mg_sZn_tCd_{1-s-t}Se$ layers 222b larger than an Mg composition x of the n-type $Mg_xZn_yCd_{1-x-y}Se$ layers 222a. Similarly, the reflectance of the p-type multilayered film 226 is increased by making an Mg composition h of the p-type $Mg_hZn_{1-h}Se_iTe_{1-i}$ layers 226a larger than an Mg composition j of the p-type $Mg_jZn_{1-j}Se_kTe_{1-k}$ layers 226b.

Light emitted by the active layer 224 is reflected by the n-type multilayered film 222 and the p-type multilayered film 226 to cause lasing in a direction perpendicular to the InP substrate 221. Since materials which can be heavily doped are used in the n-type multilayered film 222 and the p-type multilayered film 226, a low-resistance, surface emission type semiconductor laser is obtained.

In this embodiment, n- and p-type multilayered films are used as high-reflectance films. However, these multilayered films can also be designed as low-reflectance films in accordance with the intended use. only one of the n- and p-type multilayered films is also usable. Although an MgZnCdSe mixed crystal is used in the n-type multilayered film, a mixed crystal such as MgZnSeTe or MgCdSSe or a structure combining these mixed crystals can be similarly used.

Additionally, the active layer is made from an MgZnCdSe mixed crystal, but a layer made from a mixed crystal of MgZnSeTe or MgCdSSe or a layer having a composition or structure combining these mixed crystals is also usable. Likewise, a mixed crystal such as MgZnSeTe or MgCdSSe, instead of MgZnCdSe, can be used in the n-type clad layer. Furthermore, although a semiconductor laser is used as a light emitting device, other optical devices such as light emitting diodes can also be used.

[14th Embodiment]

Figure 23:
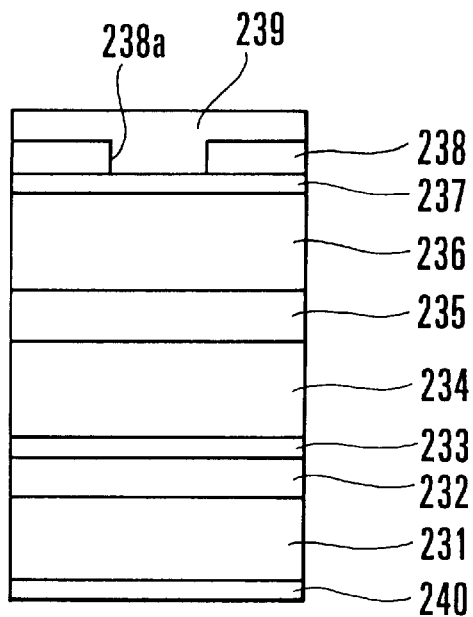
FIG. 23 is a view showing the structure of a semiconductor laser according to the 14th embodiment of the present invention.

FIG. 23 shows the structure of a semiconductor laser according to the 14th embodiment of the present invention. Referring to FIG. 23, a group III–V semiconductor buffer layer 232, a group II–VI semiconductor buffer layer 233, an n-type clad layer 234, an active layer 235, a p-type clad layer 236, and a p-type contact layer 237 are formed in this order on an n-type InP substrate 231. The group III–V semiconductor buffer layer 232 is made from n-type $Ga_{0.47}In_{0.53}As$ (thickness=0.5 μm, n-type carrier concentration=$1\times10^{18}$ $cm^{-3}$). The group II–VI semiconductor buffer layer 233 is made from $Zn_{0.48}Cd_{0.52}Se$ (thickness=0.01 μm). The n-type clad layer 234 is made from n-type $Mg_{0.2}Zn_{0.4}Cd_{0.4}Se$ (thickness=0.7 μm, n-type carrier concentration=$1\times10^{18}$ $cm^{-3}$). The active layer 235 is made from $Zn_{0.48}Cd_{0.52}Se$ (thickness=0.1 μm). The p-type clad layer 236 is made from p-type $Mg_{0.2}Zn_{0.8}Se_{0.6}Te_{0.4}$ (thickness=0.7 μm, p-type carrier concentration=$1\times10^{18}$ $cm^{-3}$). The p-type contact layer 237 is made from p-type $ZnSe_{0.54}Te_{0.46}$ (thickness=0.1 μm, p-type carrier concentration=$1\times10^{19}$ $cm^{-3}$). These semiconductor layers can be epitaxially grown by MBE.

On the p-type contact layer 237, an $SiO_2$ insulating film 238 having a stripe window 238a is formed. A p-type electrode 239 contacting the p-type contact layer 237 through the window 238a is formed on the insulating film 238. An n-type electrode 240 is formed on the back surface of the InP substrate 231. After the electrodes 239 and 240 are formed, a laser cavity mirror is formed by cleavage.

N-type $Mg_{0.2}Zn_{0.4}Cd_{0.4}Se$ is easily obtained by doping chlorine or the like. P-type $Mg_{0.2}Zn_{0.8}Se_{0.6}Te_{0.4}$ is easily obtained by doping nitrogen or the like.

Figure 24:
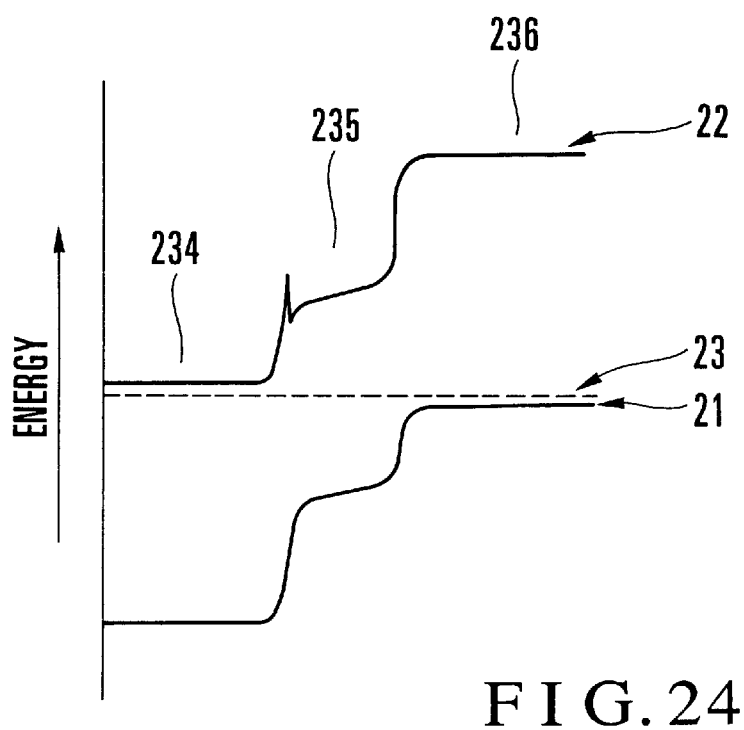
FIG. 24 is a band diagram of the semiconductor laser shown in FIG. 23.

FIG. 24 shows a band diagram of the semiconductor laser shown in FIG. 23. The band lineup of the active layer 235 and the n-type clad layer 234 is so-called type I. The band lineup of the active layer 235 and the p-type clad layer 236 is so-called type II. Accordingly, electrons are injected from the n-type clad layer 234 into the active layer 235. The injected electrons are strongly confined in the active layer 235 because the band discontinuity of a conduction band edge 22 in the interface between the active layer 235 and the p-type clad layer 236 is large.

On the other hand, the band discontinuity of a valence band edge 21 in the interface between the p-type clad layer 236 and the active layer 235 functions as a barrier to injection of holes into the active layer 235. However, since the doping concentration of the p-type clad layer 236 is sufficiently high, holes readily jump over this barrier, so practically no problem arises. If this barrier is a problem, the band gap of the clad layer 236 is increased by increasing the Mg composition. Consequently, the energy position of the valence band edge in the clad layer 236 lowers to decrease the barrier.

The holes injected into the active layer 235 are confined in the active layer 235 by the barrier of the valence band edge 21 in the interface between the active layer 235 and the n-type clad layer 234. Therefore, both the electrons and holes are efficiently confined in the active layer 235. Consequently, any leakage current from the active layer 235 is very small, and this increases the light emission efficiency of the device.

The formation of the group III–V semiconductor buffer layer 232 planarizes the crystal surface. The formation of the group II–VI semiconductor buffer layer 233 eliminates variations in compositions. This greatly reduces crystal defects and improves device lifetime. The p-type contact layer 237 has a high doping concentration of $1 \times 10^{19}$ cm$^{-3}$ and serves as a low-resistance ohmic contact. Lattice-matching with the InP substrate 231 allows stable operation over long time periods. In this embodiment, lasing at a wavelength of 590 nm occurred with a low voltage of about 2 V.

In this embodiment, the active layer is made from single-layered $Zn_{0.48}Cd_{0.52}Se$. However, it is also possible to use another structure such as single-layered MgZnCdSe, a ZnCdSe/MgZnCdSe quantum well, or a strained quantum well, or another group II–VI semiconductor such as MgZnSeTe. A light guide layer can also be formed between the active layer and the clad layer.

[15th Embodiment]

Figure 25:
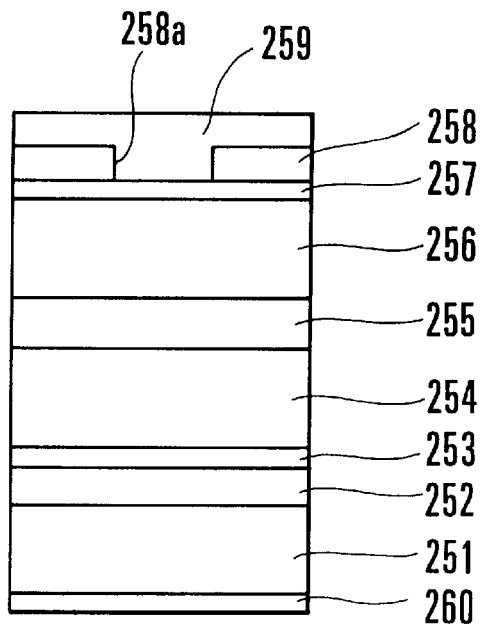
FIG. 25 is a view showing the structure of a semiconductor laser according to the 15th embodiment of the present invention.

FIG. 25 shows the structure of a semiconductor laser according to the 15th embodiment of the present invention. Referring to FIG. 25, a group III–V semiconductor buffer layer 252, a group II–VI semiconductor buffer layer 253, an n-type clad layer 254, an active layer 255, a p-type clad layer 256, and a p-type contact layer 257 are formed in this order on an n-type InP substrate 251. The group III–V semiconductor buffer layer 252 is made from n-type InP (thickness= 0.5 μm, n-type carrier concentration=$1 \times 10^{18}$ cm$^{-3}$). The group II–VI semiconductor buffer layer 253 is made from n-type $Zn_{0.48}Cd_{0.52}Se$ (thickness=0.01 μm, n-type carrier concentration=$1 \times 10^{18}$ cm$^{-3}$). The n-type clad layer 254 is made from n-type $Mg_{0.2}Zn_{0.4}Cd_{0.4}Se$ (thickness=0.7 μm, n-type carrier concentration=$1 \times 10^{18}$ cm$^{-3}$). The active layer 255 is made from $ZnSe_{0.54}Te_{0.46}$ (thickness=0.1 μm). The p-type clad layer 256 is made from p-type $Mg_{0.2}Zn_{0.8}Se_{0.6}Te_{0.4}$ (thickness=0.7 μm, p-type carrier concentration=$1 \times 10^{18}$ cm$^{-3}$). The p-type contact layer 257 is made from p-type $ZnSe_{0.54}Te_{0.46}$ (thickness=0.1 μm, p-type carrier concentration=$1 \times 10^{19}$ cm$^{-3}$). These semiconductor layers can be epitaxially grown by MBE.

On the p-type contact layer 237, an SiO$_2$ insulating film 258 having a stripe hole 258a is formed. A p-type electrode 259 contacting the p-type contact layer 257 through the hole 258a is formed on the insulating film 258. An n-type electrode 260 is formed on the back surface of the InP substrate 251. After the electrodes 259 and 260 are formed, a laser cavity mirror is formed by cleavage.

N-type $Mg_{0.2}Zn_{0.4}Cd_{0.4}Se$ is easily obtained by doping chlorine or the like. P-type $Mg_{0.2}Zn_{0.8}Se_{0.6}Te_{0.4}$ is easily obtained by doping nitrogen or the like.

Figure 26:
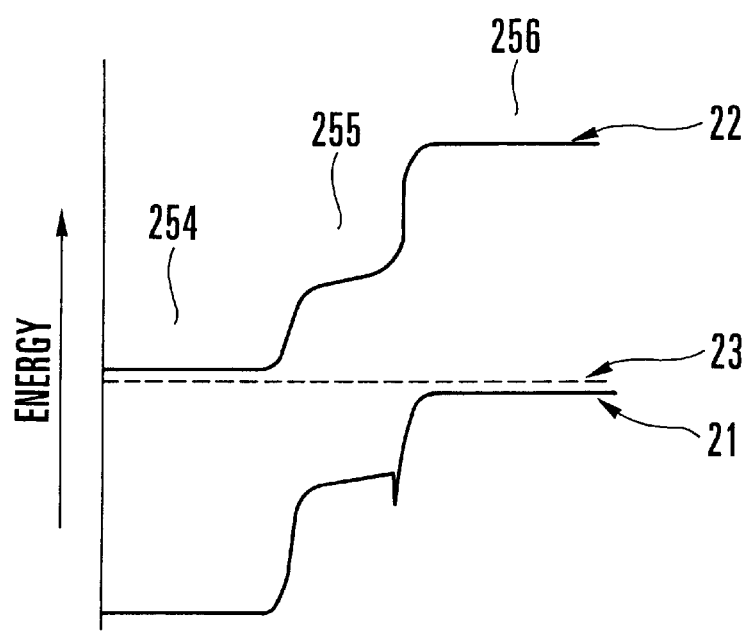
FIG. 26 is a band diagram of the semiconductor laser shown in FIG. 25.

FIG. 26 shows a band diagram of the semiconductor laser shown in FIG. 25. The band lineup of the active layer 255 and the n-type clad layer 254 is so-called type II. The band lineup of the active layer 255 and the p-type clad layer 256 is so-called type I. Accordingly, the band discontinuity of a conduction band edge 22 in the interface between the n-type clad layer 254 and the active layer 255 functions as a barrier to injection of electrons into the active layer 255. However, the doping concentration of the n-type clad layer 254 is sufficiently high, and the effective mass of an electron is small. Therefore, electrons readily jump over this barrier, so practically no problem arises.

If this barrier is a problem, the band gap of the clad layer 254 is increased by increasing the Mg composition. Consequently, the energy position of the conduction band edge in the clad layer 254 rises to decrease the barrier. The electrons injected into the active layer 255 are confined in the active layer 255 by the barrier of the conduction band edge 22 in the interface between the active layer 255 and the p-type clad layer 256.

On the other hand, holes are injected from the p-type clad layer 256 into the active layer 255. The injected holes are strongly confined in the active layer 255 by a large barrier in the interface between the active layer 255 and the n-type clad layer 254. Therefore, both the electrons and holes are efficiently confined in the active layer 255. Consequently, any leakage current from the active layer 255 is very small, and this increases the light emission efficiency of the device.

The formation of the group III–V semiconductor buffer layer 252 planarizes the crystal surface. The formation of the group II–VI semiconductor buffer layer 253 eliminates variations in compositions. This greatly reduces crystal defects and improves device lifetime. The p-type contact layer 257 has a high doping concentration of $1 \times 10^{19}$ cm$^{-3}$ and serves as a low-resistance ohmic contact. Lattice-matching with the InP substrate 251 allows stable operation over long time periods. In this embodiment, laser operation at a wavelength of 590 nm occurred with a low voltage of about 2 V.

In this embodiment, the active layer is made from single-layered $ZnSe_{0.54}Te_{0.46}$. However, it is also possible to use another structure such as single-layered MgZnSeTe, a ZnSeTe/MgZnCdSe quantum well, or a strained quantum well, or other group II–VI semiconductors such as ZnCdSeTe. A light guide layer can also be formed between the active layer and the clad layer.

The light emitting device of the present invention uses an InP substrate and an MgZnSeTe-based compound semiconductor which allows easy doping of a p-type carrier in a p-type clad layer. Accordingly, the resistance of the device is small, and the operating voltage of the device is low. Consequently, the device does not generate a large amount of heat and hence has good temperature characteristics. Also, since an active layer, a p-type clad layer, and an n-type clad layer are lattice-matched with InP, crystal defects are reduced. Therefore, the device stably operates over long time periods and is highly reliable.

What is claimed is:

1. A semiconductor light emitting device having a stacked structure comprising an n-type clad layer, an active layer, and a p-type clad layer on an InP substrate, wherein said p-type clad layer is made from an MgZnSeTe-based compound semiconductor lattice-matched with InP, and said n-type clad layer is made from a compound semiconductor lattice-matched with InP and selected from the group consisting of an MgZnSeTe-based compound semiconductor, an MgZnCdSe-based compound semiconductor, and an MgCdSSe-based compound semiconductor said light emitting device further comprises a p-type contact layer formed on said p-type clad layer and made from a p-type MgZnSeTe based II–VI compound semiconductor lattice-matched with InP, and said p-type contact layer has an Mg composition smaller than an Mg composition of said p-type clad layer and a p-type carrier concentration of not less than $1\times10^{-18}$ cm$^{-3}$.

2. A device according to claim 1, wherein said active layer is made from a p-n junction of said n-type clad layer and said p-type clad layer.

3. A device according to claim 1, wherein said active layer is made from a ZnCdSeTe-based compound semiconductor.

4. A device according to claim 1, wherein said active layer is made from one of a single layer, a quantum well structure, and a quantum wire structure of a compound semiconductor selected from the group consisting of an MgZnSeTe-based compound semiconductor, an MgZnCdSe-based compound semiconductor, and an MgCdSSe-based compound semiconductor.

5. A device according to claim 1, further comprising a p-side light guide layer formed between said active layer and said p-type clad layer, having a thickness of not more than 300 nm, and made from a p-type/undoped compound semiconductor selected from the group consisting of an MgZnCdSe-based compound semiconductor, an MgCdSSe-based compound semiconductor, and an MgZnSeTe-based compound semiconductor.

6. A device according to claim 1, further comprising an n-side light guide layer formed between said active layer and said n-type clad layer, having a thickness of not more than 300 nm, and made from an n-type/undoped compound semiconductor selected from the group consisting of an MgZnCdSe-based compound semiconductor, an MgCdSSe-based compound semiconductor, and an MgZnSeTe-based compound semiconductor.

7. A device according to claim 1, further comprising:
a p-side light guide layer formed between said active layer and said p-type clad layer, having a thickness of not more than 300 nm, and made from a p-type/undoped compound semiconductor selected from the group consisting of an MgZnCdSe-based compound semiconductor, an MgCdSSe-based compound semiconductor, and an MgZnSeTe-based compound semiconductor; and
an n-side light guide layer formed between said active layer and said n-type clad layer, having a thickness of not more than 300 nm, and made from an n-type/undoped compound semiconductor selected from the group consisting of an MgZnCdSe-based compound semiconductor, an MgCdSSe-based compound semiconductor, and an MgZnSeTe-based compound semiconductor.

8. A device according to claim 1, wherein said n-type clad layer, said active layer, and said p-type clad layer are stacked in this order on said InP substrate of n-type.

9. A device according to claim 8, wherein said p-type contact layer is made from a material selected from the group consisting of a single layer, a multiple layer, or a superlattice layer of an MgZnSeTe-based compound semiconductor and a graded layer whose Mg composition decreases in a direction away from said InP substrate.

10. A device according to claim 1, wherein
said n-type clad layer, said active layer, and said p-type clad layer are stacked in this order on said InP substrate of p-type,
said light emitting device further comprises a p-type connecting layer formed between said p-type clad layer and said InP substrate and made from a p-type MgZnSeTe-based II–VI compound semiconductor lattice-matched with InP, and
said p-type connecting layer has an Mg composition smaller than an Mg composition of said p-type clad layer.

11. A device according to claim 10, wherein said p-type connecting layer is made from a material selected from the group consisting of a single layer, a multiple layer, or a superlattice layer of an MgZnSeTe-based compound semiconductor and a graded layer whose Mg composition decreases in a direction away from said InP substrate.

12. A device according to claim 8, further comprising a group III–V semiconductor buffer layer formed between said InP substrate and said stacked structure and lattice-matched with InP,
wherein said group III–V semiconductor buffer layer is made from one of a single layer and a multiple layer of a compound semiconductor selected from the group consisting of an InP compound semiconductor, an InGaAsP-based compound semiconductor, an InGaAlAs-based compound semiconductor, and an InAlAsP-based compound semiconductor.

13. A device according to claim 8, further comprising a group II–VI semiconductor buffer layer formed between said InP substrate and said stacked structure and lattice-matched with InP,
wherein said group II–VI semiconductor buffer layer is made from one of a single layer and a multiple layer of a material selected from the group consisting of ZnCdSe, CdS, and MgSe.

14. A device according to claim 8, further comprising a group II–VI semiconductor buffer layer formed between said InP substrate and said stacked structure and made from one of a single layer and a multiple layer of a material selected from the group consisting of ZnCdSe, CdS, and MgSe each having a thickness not more than a critical film thickness.

15. A device according to claim 8, further comprising a multilayered film formed on at least one surface of said stacked structure and having a periodic structure of two types of II–VI compound semiconductors having a thickness ¼ an emission wavelength,
wherein said multilayered film extracts light in a direction perpendicular to said InP substrate.

16. A device according to claim 8, further comprising:
a first electrode formed on said stacked structure; and
a second electrode formed on a back surface of said InP substrate.

* * * * *